United States Patent [19]
Norimatsu

[11] Patent Number: 5,089,794
[45] Date of Patent: Feb. 18, 1992

[54] VIBRATION ABSORBING CASE FOR AN OSCILLATOR

[75] Inventor: Hidehiko Norimatsu, Tokyo, Japan

[73] Assignee: NEC Corporation, Tokyo, Japan

[21] Appl. No.: 588,391

[22] Filed: Sep. 26, 1990

[30] Foreign Application Priority Data

Sep. 26, 1989 [JP] Japan ................ 1-249463

[51] Int. Cl.⁵ .................. H03B 1/00; H05K 5/04
[52] U.S. Cl. .................. 331/68; 174/52.1; 361/399
[58] Field of Search .............. 331/68, 69, 67; 361/394, 399, 415; 174/50, 52.1, 52.3, 52.5, 35 R

[56] References Cited

U.S. PATENT DOCUMENTS 4,091,232 5/1978 Lenk et al. .................. 331/68 X
4,332,001 5/1982 Tateishi et al. .................. 361/399

FOREIGN PATENT DOCUMENTS 3335530 4/1985 Fed. Rep. of Germany ...... 361/399

*Primary Examiner*—Siegfried H. Grimm
*Attorney, Agent, or Firm*—Sughrue, Mion, Zinn, Macpeak & Seas

[57] ABSTRACT

The structure of a shield case for covering circuitry loaded on a hybrid substrate of an oscillator and thereby isolating the circuitry from the outside. The shield case has a bottom-open box-like configuration and is made of a conductive material. The conductive material is implemented with alloy which absorbs vibrations and thereby intercepts vibrations otherwise imparted from the outside to the circuitry. The physical distance between the vibration absorbing shield case and various parts of the circuitry provided on the substrate is not changed in spite of the external vibrations, whereby the oscillation frequency of the oscillator is maintained constant.

8 Claims, 7 Drawing Sheets

VIBRATION ABSORBING CASE FOR AN OSCILLATOR

BACKGROUND OF THE INVENTION

The present invention relates to an oscillator and, more particularly, to the structure of a shield case for an oscillator which reduces the variation in the oscillation characteristics of the oscillator ascribable to the changes in environmental conditions.

It is a common practice with an oscillator to cover a body thereof with a shield case made of brass, phosphor bronze or similar metal, so that the body may be protected against external electromagnetic fields. Therefore, stray capacitance unavoidably exists between the shield case and various parts constituting the circuitry of the oscillator. When vibration is applied from the outside to the oscillator, it causes the shield case to vibrate since the the latter is not implemented with a vibration absorbing material. The vibration of the shield case changes the physical distance between the inner periphery thereof and the component parts of the circuitry and, therefore, the stray capacitance. As a result, the externally derived vibration adversely affects the oscillation characteristics of the oscillator such as oscillation frequency, preventing the oscillator from oscillating in a stable manner.

SUMMARY OF THE INVENTION

It is therefore an object of the present invention to provide a shield case structure which allows an oscillator associated therewith to undergo a minimum of variation in the oscillating state thereof against external vibrations and, therefore, to oscillate stably at all times.

It is another object of the present invention to provide a generally improved shield case structure for an oscillator.

In an oscillator having circuitry which is covered with a shield case, the shield case comprises a conductive member which absorbs vibrations which may be applied to the shield case from the outside.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

A preferred embodiment of the shield case structure in accordance with the present invention will be described in detail with reference to the accompanying drawings.

Figure 1:
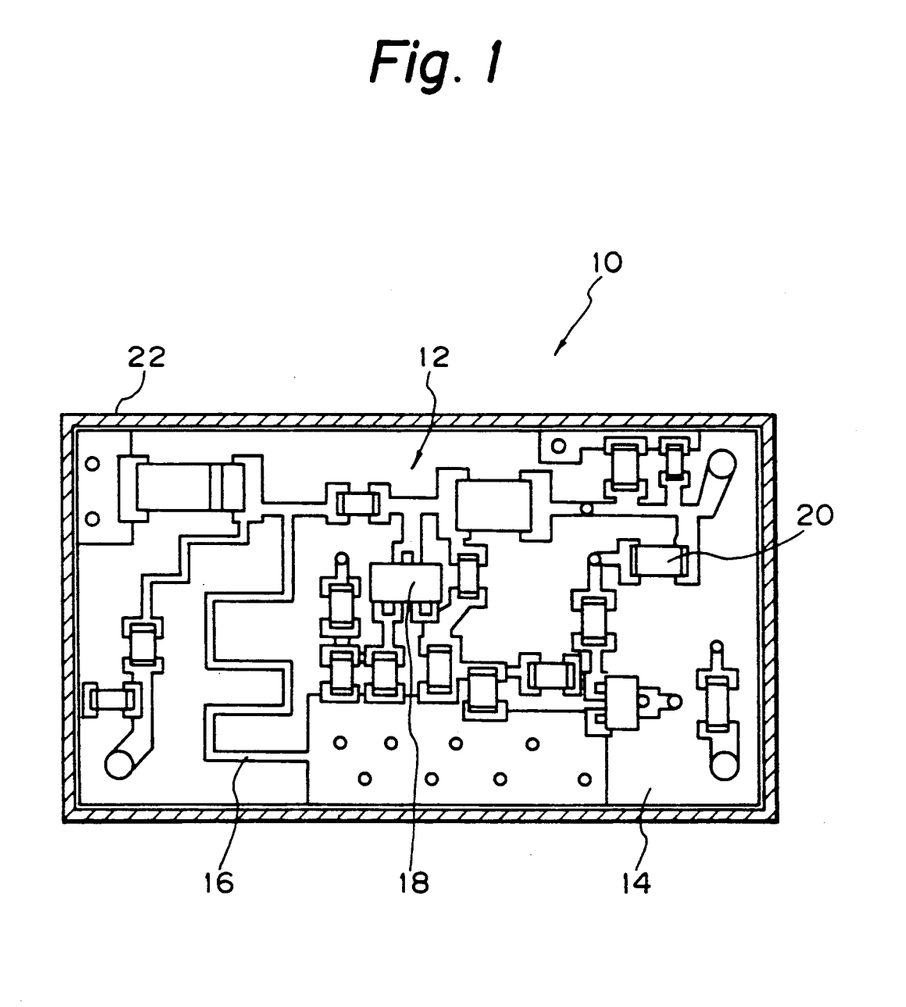
FIG. 1 is a section showing a specific construction of an oscillator to which the present invention is applicable.
Figure 2:
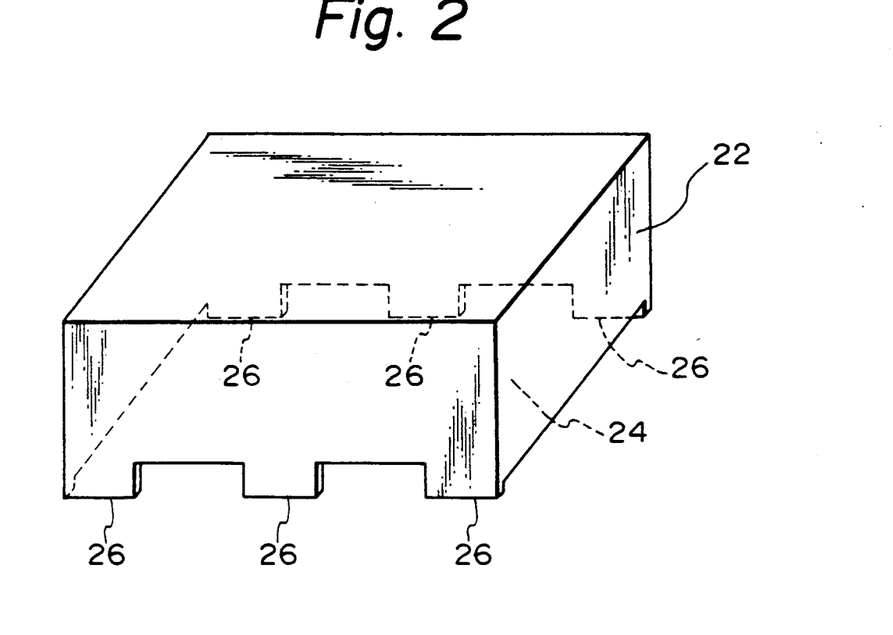
FIG. 2 is a perspective view of a shield case embodying the present invention.

FIG. 1 shows specific circuitry 12 provided on the body of a voltage controlled oscillator (VCO), for example, to which the illustrative embodiment of the present invention is applied. Specifically, provided on a hybrid substrate 14, the circuitry 12 has a strip line 16, various active elements 18, various passive elements 20, etc. The back (not visible) of the hybrid substrate 14 is connected to ground. FIG. 2 shows a shield case 22 embodying the present invention. The shield case 22 covers the circuitry 12 of the substrate 14 to isolate it from the outside, as shown in FIG. 1. As FIG. 2 indicates, the shield case 22 has a box-like configuration having an opening 24 at the bottom thereof. A part 26 of the edges of the shield case 22 which define the opening 24 is soldered or otherwise connected to the back or grounding surface of the substrate 14. Assume that the face of the substrate 14, as distinguished from the back, is configured as a grounding surface. Then, use may be made of a modified shield case 22A shown in FIG. 3. Specifically, the modified shield case 22A has tongues 26a formed by bending a part of the edges of the opening 24 at right angle and soldered or otherwise connected to the edge portions of the face or grounding surface of the substrate 14.

Figure 3:
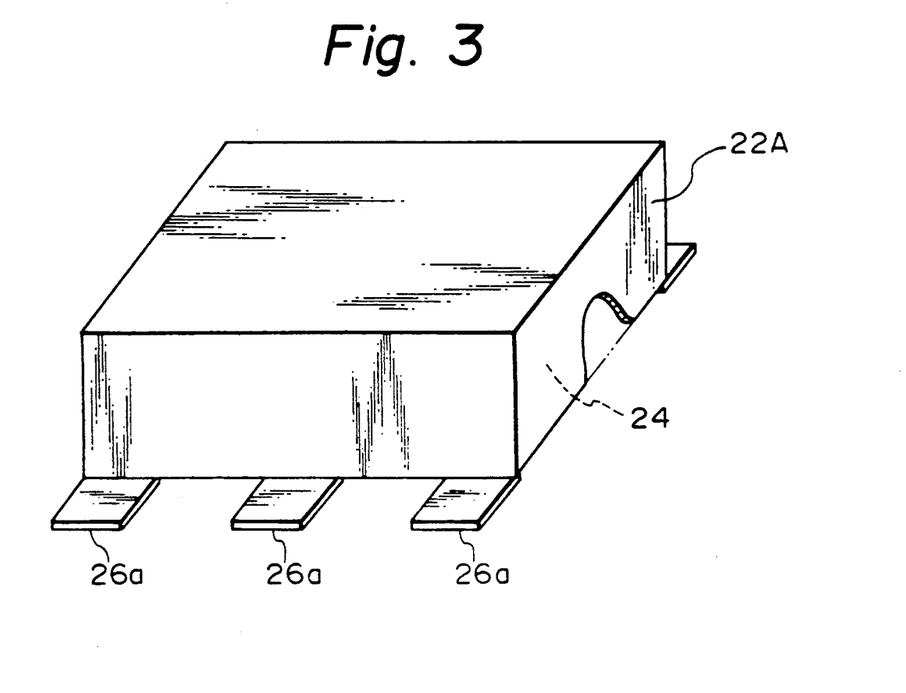
FIG. 3 is a perspective view showing a modified form of the shield case shown in FIG. 2.

The shield cases 22 and 22A shown in FIGS. 2 and 3 each is implemented as a conductive material, particularly a sheet of alloy which absorbs vibrations. Typical of vibration absorbing alloy sheets is Gentalloy F series available from Toyo Aluminum (Japan). The shield cases 22 and 22A which are vibration-absorptive as mentioned above absorb vibrations which may be applied from the outside to the VCO 10, i.e., they do not vibrate. This prevents the physical distance between the shield case 22 or 22A and the various elements or parts of the circuitry 12 and, therefore, the stray capacitance existing between them from varying in spite of the vibrations. As a result, the oscillation characteristics of the VCO 10 such as oscillation frequency changes little.

Figure 4:
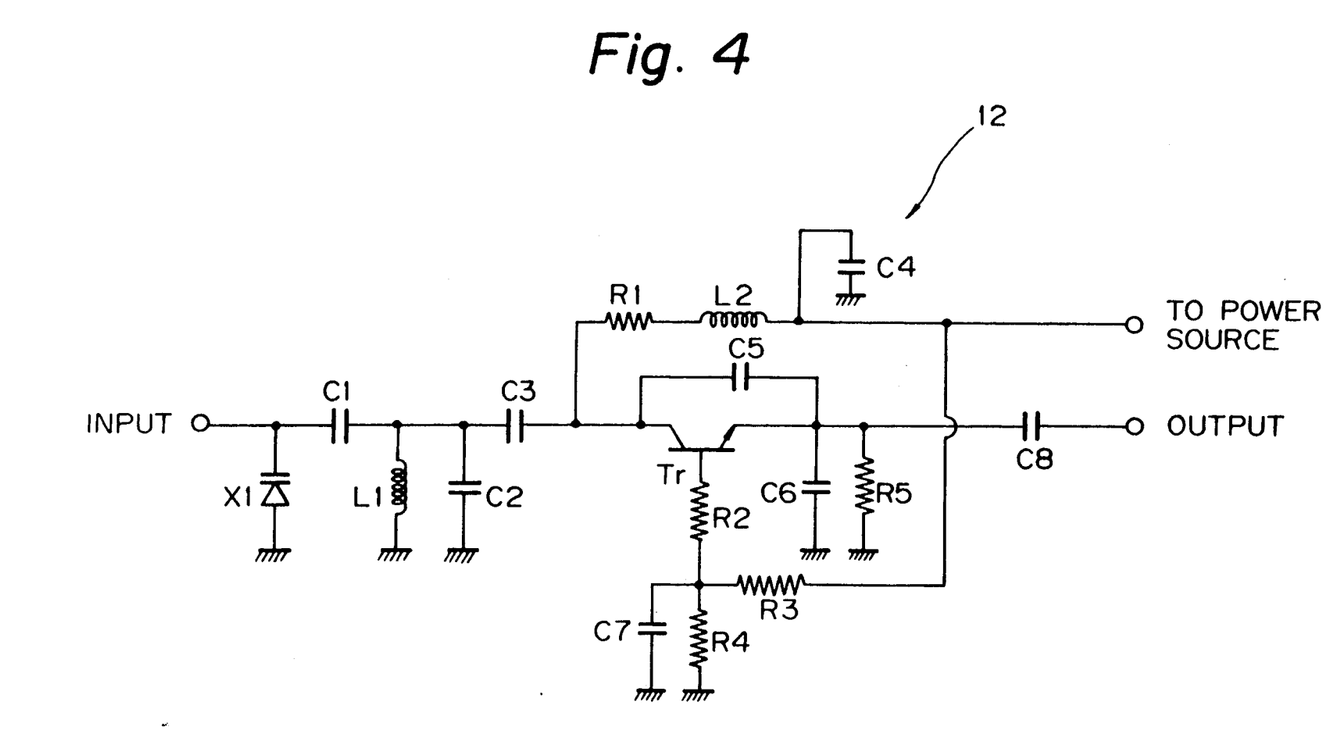
FIG. 4 is a circuit diagram representative of an oscillator to which any of the shield cases shown in FIGS. 2 and 3 is applicable.

FIG. 4 shows a specific construction of the circuitry 12 provided on the body of the VCO 10 and which is implemented as a Colpitts oscillator by way of example. The oscillation frequency of the VCO 10 shown in FIG. 4 is determined by the capacitances of capacitors C5 and C6 and the composite inductance of various elements which are located closer to the input terminal than a capacitor C3. A varactor diode X1 changes its capacitance in response to a DC input voltage, while a capacitor C1 blocks DC components. An inductor L1 is implemened as a coil for oscillation and adjusts the oscillation frequency. The capacitor C3 blocks DC components applied to the collector of a transistor Tr. Assuming that the input is open, and that the impedance of the elements preceding the capacitor C3 is Z, then the impedance Z is expressed as:

$$Z = \frac{sL1(X1 + C1)}{s^2L1[X1 \cdot C1 + C2(X1 + C1)] + X1 + C1} + \frac{1}{sC3}$$

where s is the Laplace operator.

Further, the impedance Z may be produced by:

$$Z = j\omega \hat{Z}(\omega)$$

where $\hat{Z}(\omega)$ is representative of a real function.

Therefore, it may be regarded that a coil having an inductance $\hat{Z}(\omega)$ exists between the input terminal and the capacitor C3. Resistors R1 and R2 free the transistor Tr from unusual oscillations, while an inductor L2 is a choke coil for preventing high frequency from leaking into the power source. Capacitors C4 and C7 release noise from the power source to ground. A capacitor C8 blocks DC components. Further, resistors R3 and R4 are bleeder resistors for determining the operating point of the transistor Tr, while a resistor R5 is an emitter resistor for determining the same.

Assuming that the oscillation frequency of the VCO 10 which is dependent on the capacitors C5 and C6 and inductor $\hat{Z}(\omega)$ is $f_o$, it is expressed as:

$$f_o = \frac{1}{2\pi} \sqrt{\frac{\frac{1}{C5} + \frac{1}{C6}}{\hat{Z}(\omega_o)}} \quad (\omega_o = 2\pi f_o)$$

However, since the circuitry 12 of the VCO 10 arranged as shown in FIG. 4 is covered with the shield case 22 (FIG. 2) or 22A (FIG. 3), stray capacitance is developed between the shield case 22 or 22A and the circuit parts and elements. Specifically, the oscillation frequency $f_o$ is affected by the stray capacitance developed from the collector of the transistor Tr to ground in parallel with the capacitors C2 and C6 and varactor diode X1. When the previously mentioned constants C2, X1, C6 and $\hat{Z}(\omega_0)$ are considered as variables, the degree to which the stray capacitance affects the oscillation frequency $f_0$ may be expressed by partial differentiation. However, which of such constants has the greatest influence is difficult to determine. In any case, it is obvious that the shield case caused to vibrate by the externally derived vibration changes the stray capacitance and, as a result, the oscillation frequency is changed as if it were frequency modulated with the vibrations. The shield case 22 or 22A in accordance with the present invention absorbs external vibrations and, therefore, does not vibrate since it is made of a conductive vibration-absorptive material. This is successful in preventing the oscillation frequency from being changed by the change in stray capacitance.

An oscillator with a conventional shield case which is made of phosphor bronze or similar metal and an oscillator with a shield case of the present invention which is implemented with a conductive vibration-absorptive material were compared with respect to the S/N ratio, as follows.

Figure 5:
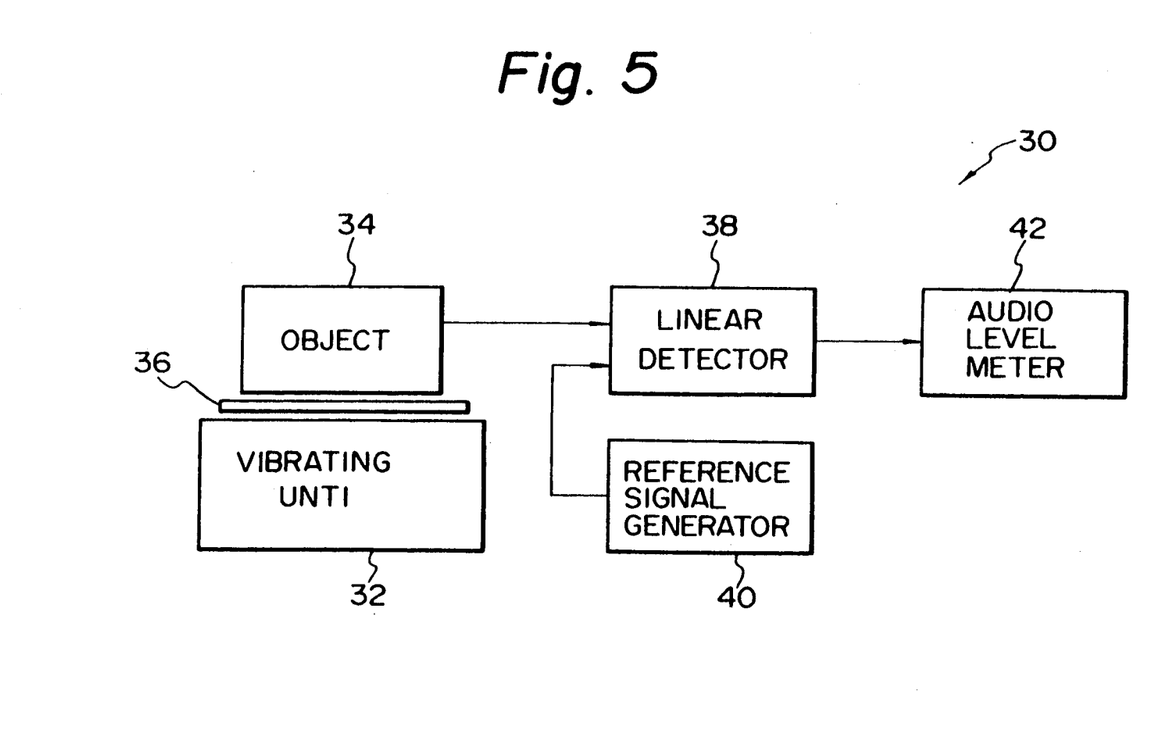
FIG. 5 is a block diagram schematically showing an arrangement usable to measure the S/N (Signal-to-Noise) ratios attainable with a conventional shield case and a shield case of the present invention against externally derived vibrations.

As shown in FIG. 5, an arrangement used for measurement, generally 30, has a vibrating unit 32 which is loaded with an object 34 with the intermediary of a 30 millimeters thick baked plate 36. The vibrating unit 32 vibrates the object 34, i.e., the conventional oscillator or the oscillator implemented with the present invention by way of the baked plate 36. The object 34 is affixed to the baked plate 36 at three points, while the baked plate 36 is affixed to the vibrating unit 32 at six points. For measurement, the vibrating unit 32 caused the object 34 to vibrate by 0.24 millimeter (peak-to-peak) at 10 to 50 hertz and by the gravitational acceleration of 1.53 over 50 hertz. The arrangement 30 further has a linear detector 38 to which the outputs of the object 34 and a reference signal generator 40 are applied, and an audio level meter 42 to which the output of the linear detector 38 is applied. The reference signal generator 40 generates an FM signal of 3 kilohertz with 1 kilohertz deviation. The linear detector 38 has no frequency band limitation and the audio level meter 42 includes a psophometric filter therein.

Figure 6:
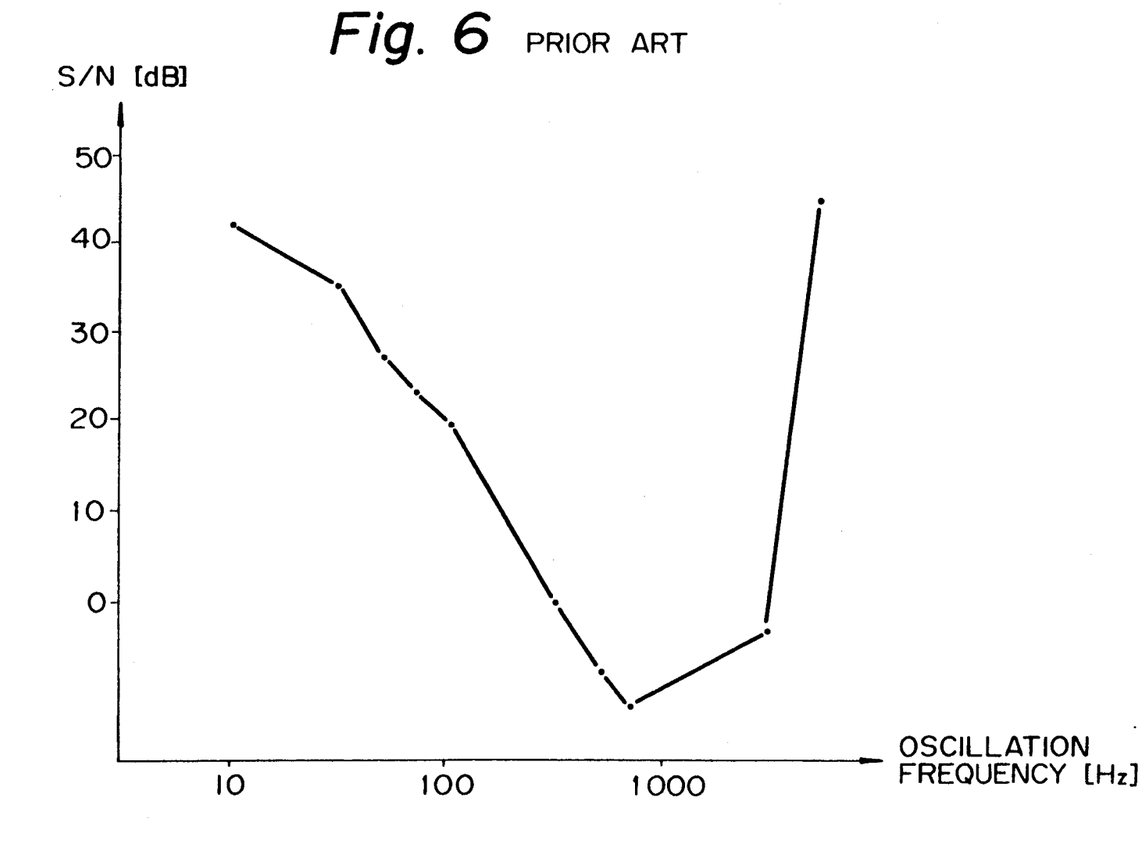
FIGS. 6 and 7 are graphs showing S/N ratios particular to conventional shield cases each having a particular thickness.
Figure 7:
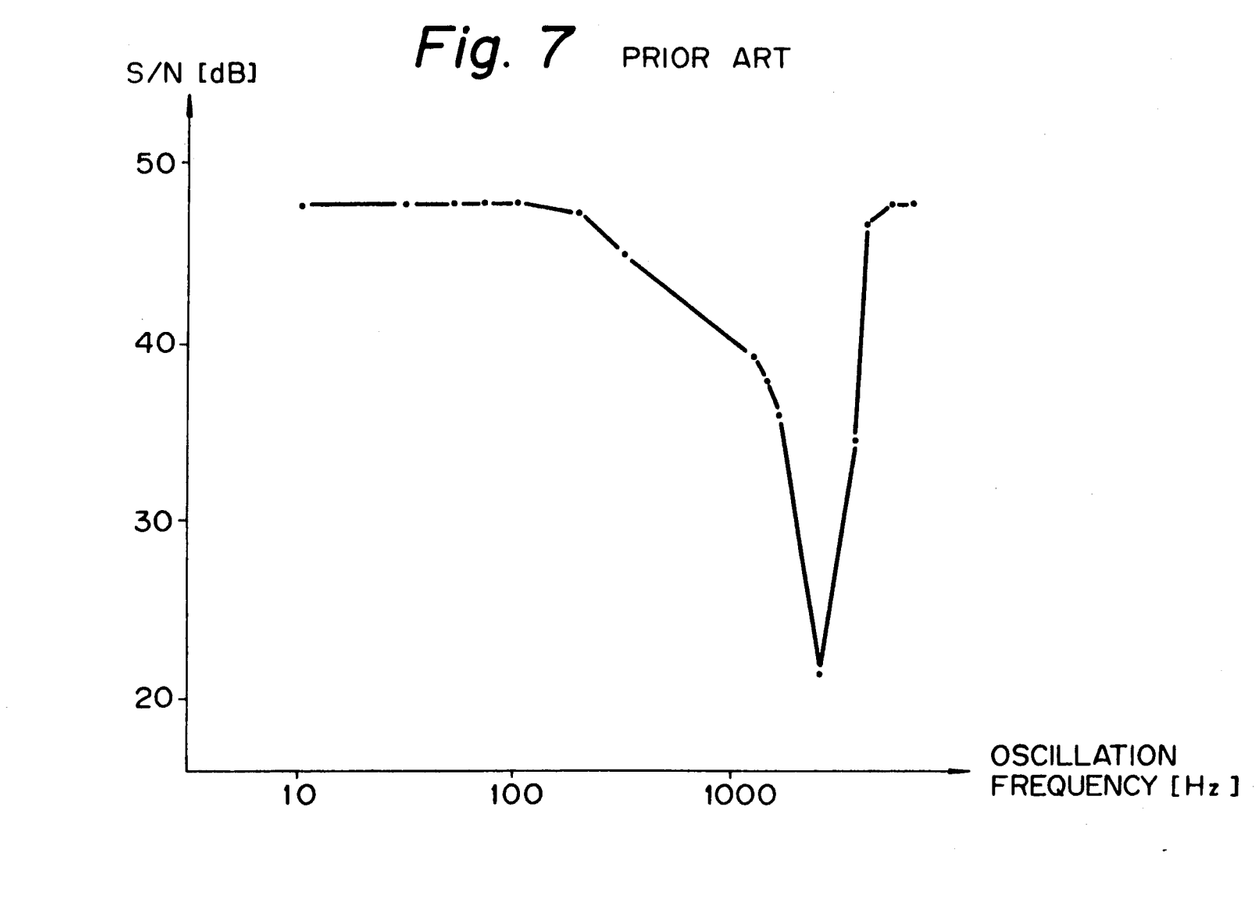
Figure 8:
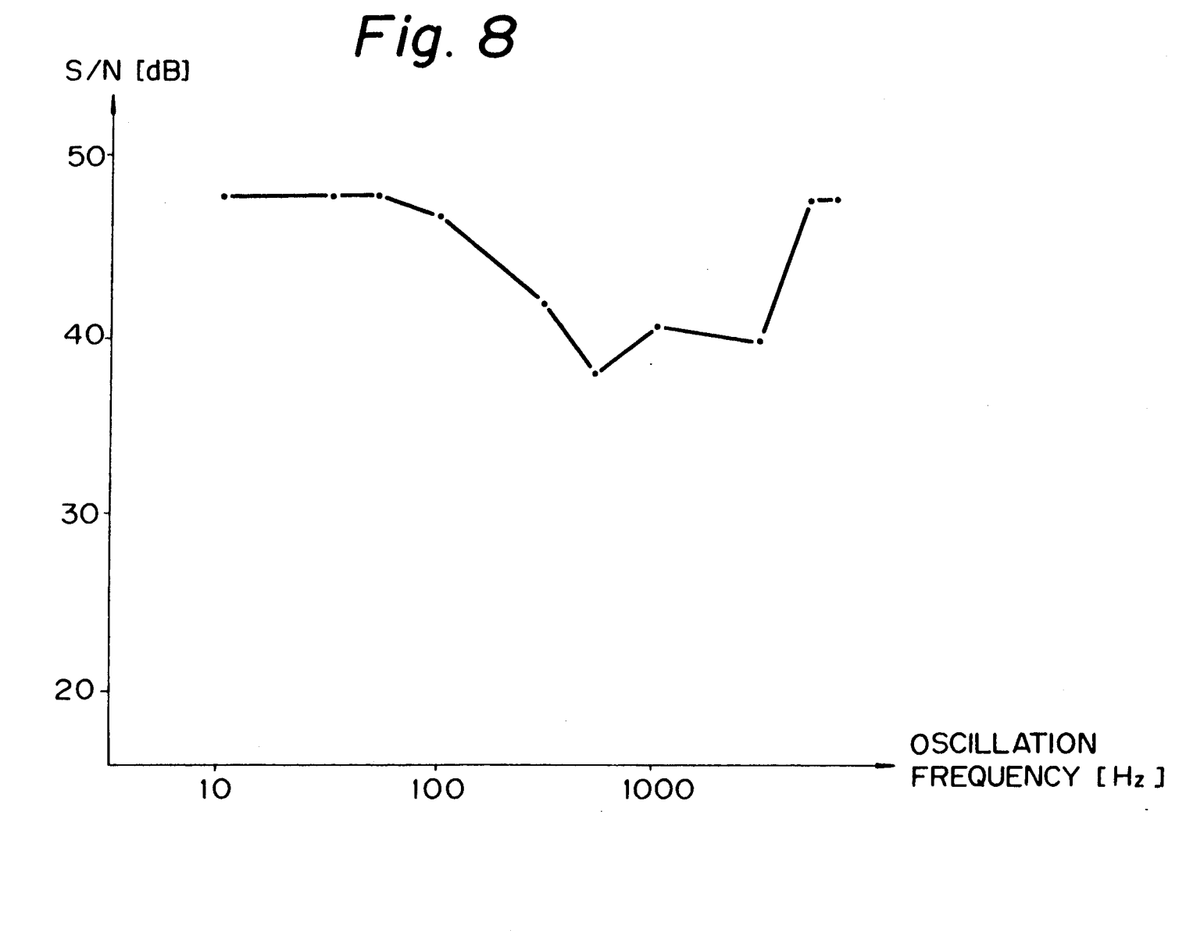
FIG. 8 is a graph showing S/N ratios obtained with an oscillator having a shield case in accordance with the present invention.

Assume that the audio level determined by the linear detector 38 by demodulating the output of the object 34 under vibration is N, and that the audio level determined by the detector 38 by demodulating the output of the reference signal generator 40 is S. First, the S/N ratio was determined with the conventional shield case by the arrangement 30. Specifically, a 0.3 millimeter thick and a 1.0 millimeter thick conventional shield case both of which were made of phosphor bronze were used. FIGS. 6 and 7 indicate respectively the S/N ratio (dB) to vibration frequency (Hz) characteristics particular to the oscillator with the 0.3 millimeter thick shield case and the 1.0 millimeter thick shield case, as determined by the measurement. By contrast, FIG. 8 shows a S/N radio (dB) to vibration frequency (Hz) characteristic obtained with the oscillator with the shield case of the present invention. The shield case of the present invention was implemented with a 0.3 millimeter thick vibration-absorptive alloy (Gentalloy F series available from Toyo Aluminum).

The minimum S/N ratio of the conventional shield case shown in FIG. 6 is smaller than zero decibel, and that of the conventional shield case shown in FIG. 7 is about 21 decibels. On the other hand, the minimum S/N ratio particular to the present invention is 38 decibels as shown in FIG. 8, which is a remarkable improvement over the prior art.

In summary, it will be seen that the present invention provides a shield case structure which is made of a conductive vibration-absorptive material and, therefore, not susceptible to external vibrations. This prevents the physical distance between the shield case and circuitry provided on the body of an oscillator from changing. As a result, the oscillator with such a shield case is capable of oscillating stably in spite of vibrations which may be applied from the outside.

Various modifications will become possible for those skilled in the art after receiving the teachings of the present disclosure without departing from the scope thereof.

What is claimed is:

1. An oscillator comprising:
    a substrate having two surfaces on one of which a ground pattern is provided;
    oscillator circuitry mounted on said substrate;
    a shield case for covering said circuitry, said shield case comprising a conductive member which absorbs vibrations which may be applied to said shield case from outside; and
    means for soldering said shield case to said ground pattern.

2. An oscillator as claimed in claim 1, wherein said conductive member comprises a sheet of vibration absorbing alloy.

3. An oscillator as claimed in claim 2, wherein said sheet of vibration absorbing alloy is 0.2 millimeter thick.

4. An oscillator as claimed in claim 1, wherein said shield case has a box-like configuration having an opening at bottom.

5. An oscillator as claimed in claim 4, wherein said circuitry is mounted on the one of said two surfaces, and wherein said shield case includes belt tongue portions soldered to said ground pattern.

6. An oscillator as claimed in claim 4, wherein said circuitry is mounted on the other one of said two surfaces, and wherein said shield case includes edge portions soldered to said ground pattern.

7. An apparatus comprising:
   substrate means for mounting oscillator circuitry thereon; and
   shield means for covering and electrically shielding said circuitry, said shield means being comprised of a conductive material which absorbs vibrations which may affect the oscillation frequency of said oscillator circuitry; and
   means for soldering said shield means to a ground pattern on said substrate means.

8. A method of mounting oscillator circuitry, comprising the following steps of:
   mounting said circuitry on a substrate;
   covering said circuitry with a shield case composed of a material which absorbs vibrations which may affect the oscillation frequency of said oscillator circuitry; and
   soldering said shield case to a ground pattern on said substrate.

* * * * *

UNITED STATES PATENT AND TRADEMARK OFFICE
CERTIFICATE OF CORRECTION

PATENT NO. : 5,089,794
DATED : February 18, 1992
INVENTOR(S) : Hidehiko NORIMATSU It is certified that error appears in the above-identified patent and that said Letters Patent is hereby corrected as shown below:

Col. 3, line 23 delete "Z" and insert --$\hat{Z}$--.

Signed and Sealed this

First Day of June, 1993

Attest:

MICHAEL K. KIRK

Attesting Officer

Acting Commissioner of Patents and Trademarks